United States Patent
Chang et al.

(10) Patent No.: US 12,124,168 B2
(45) Date of Patent: Oct. 22, 2024

(54) METHOD AND APPARATUS FOR COATING PHOTORESIST OVER A SUBSTRATE

(71) Applicant: TAIWAN SEMICONDUCTOR MANUFACTURING COMPANY, LTD., Hsinchu (TW)

(72) Inventors: Jing Chang, Taoyuan (TW); Ching-Hai Yang, Taipei (TW); Wei-Hsiang Tseng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 413 days.

(21) Appl. No.: 17/557,146

(22) Filed: Dec. 21, 2021

(65) Prior Publication Data

US 2022/0365435 A1    Nov. 17, 2022

Related U.S. Application Data

(60) Provisional application No. 63/189,024, filed on May 14, 2021.

(51) Int. Cl.
G03F 7/16 (2006.01)
G05B 13/02 (2006.01)
(Continued)

(52) U.S. Cl.
CPC .......... G03F 7/16 (2013.01); G05B 13/027 (2013.01); G06T 7/001 (2013.01); G06T 7/60 (2013.01);
(Continued)

(58) Field of Classification Search
CPC .......... H01L 21/0274; H01L 21/0273; H01L 21/68764; H01L 21/6715; H01L 21/67017; H01L 21/67051; H01L 21/02282; G06T 1/0014; G06T 2207/20081; G06T 2207/20084; G06T 7/001; G03F 7/162; G03F 7/3021
See application file for complete search history.

(56) References Cited

U.S. PATENT DOCUMENTS

2021/0150697 A1* 5/2021 Estrella .................... G06T 7/70

FOREIGN PATENT DOCUMENTS

KR    20210125635 A  * 10/2021

* cited by examiner

*Primary Examiner* — Edward Chin
(74) *Attorney, Agent, or Firm* — STUDEBAKER & BRACKETT PC

(57) ABSTRACT

A method for manufacturing a semiconductor device includes obtaining a first image of a fluid dispense nozzle using a first camera, the fluid dispense nozzle configured to dispense fluid on a semiconductor substrate, obtaining a second image of the fluid dispense nozzle using a second camera, the second image having a higher resolution than the first image, determining a width of the fluid dispense nozzle at multiple intervals along the fluid dispense nozzle and a width of a spray pattern of a fluid being dispensed from the fluid dispense nozzle at multiple intervals along the spray pattern, fitting a first straight line to a series of data points representing a plurality of widths of the intervals along the fluid dispense nozzle and a plurality of widths of the intervals along the spray pattern, determining a first slope of the first straight line, and determining a condition of the spray pattern and the fluid dispense nozzle based on the first slope.

20 Claims, 8 Drawing Sheets

(51) Int. Cl.
*G06T 7/00* (2017.01)
*G06T 7/60* (2017.01)
*H01L 21/027* (2006.01)
*H01L 21/66* (2006.01)
*H04N 23/90* (2023.01)

(52) U.S. Cl.
CPC .......... *H01L 21/0273* (2013.01); *H01L 22/20* (2013.01); *H04N 23/90* (2023.01); *G06T 2207/20081* (2013.01); *G06T 2207/20084* (2013.01); *G06T 2207/30148* (2013.01)

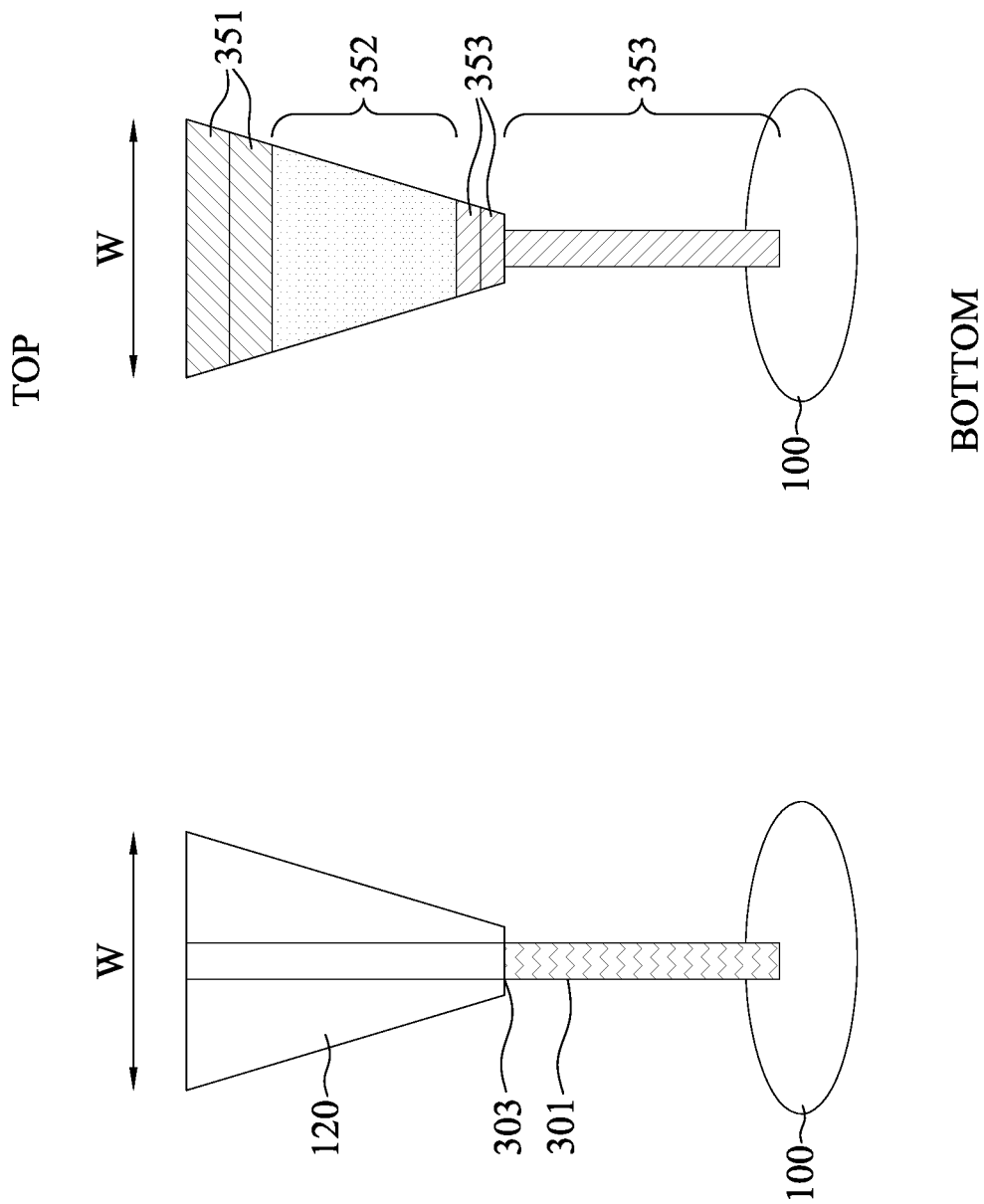

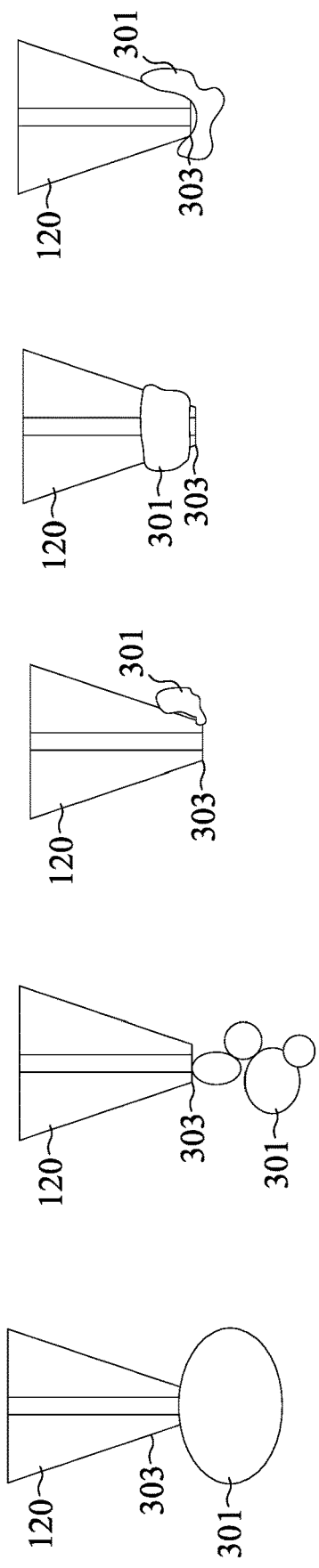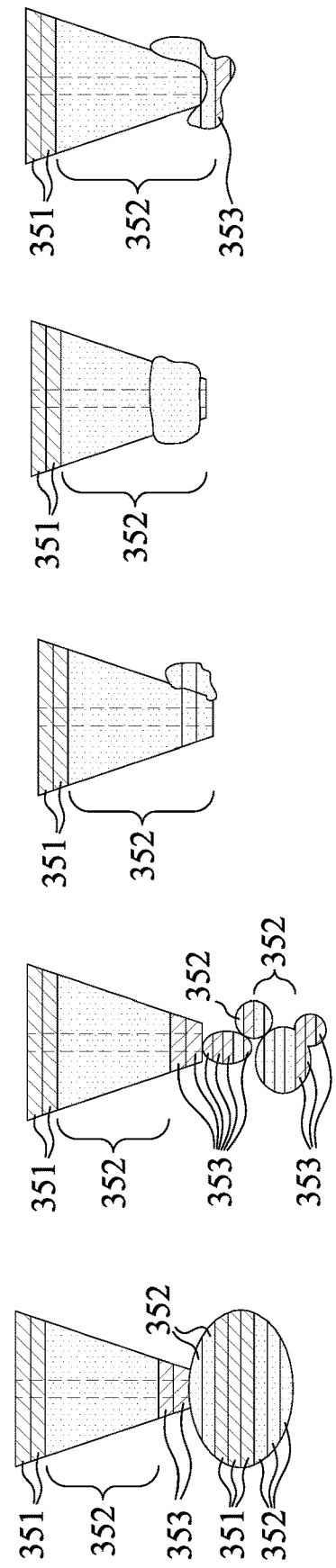
FIG. 4A  FIG. 4B  FIG. 4C  FIG. 4D  FIG. 4E

METHOD AND APPARATUS FOR COATING PHOTORESIST OVER A SUBSTRATE

CROSS-REFERENCE TO RELATED APPLICATIONS

This application claims priority to U.S. Provisional patent application No. 63/189,024 filed on May 14, 2021, the entire disclosure of which is incorporated herein by reference.

BACKGROUND

A photolithography operation is one of the key operations in the semiconductor manufacturing process. Photolithography techniques include ultraviolet lithography, deep ultraviolet lithography, and extreme ultraviolet lithography (EUVL). A photolithography operation is generally a high cost process, and reduction of the cost is one of the problems to be solved. In particular, in EUV lithography, the cost of the photoresist is much higher than the cost of a deep UV resist.

BRIEF DESCRIPTION OF THE DRAWINGS

FIG. 3A is a schematic view of the nozzle dispensing photoresist.

FIG. 3B illustrates an image of the nozzle after image processing has been performed, according to embodiments of the disclosure.

FIGS. 4A, 4B, 4C, 4D, and 4E are schematic views of different unacceptable spray patterns dispensed from the nozzle, according to embodiments of the disclosure.

DETAILED DESCRIPTION

Figure 1A:
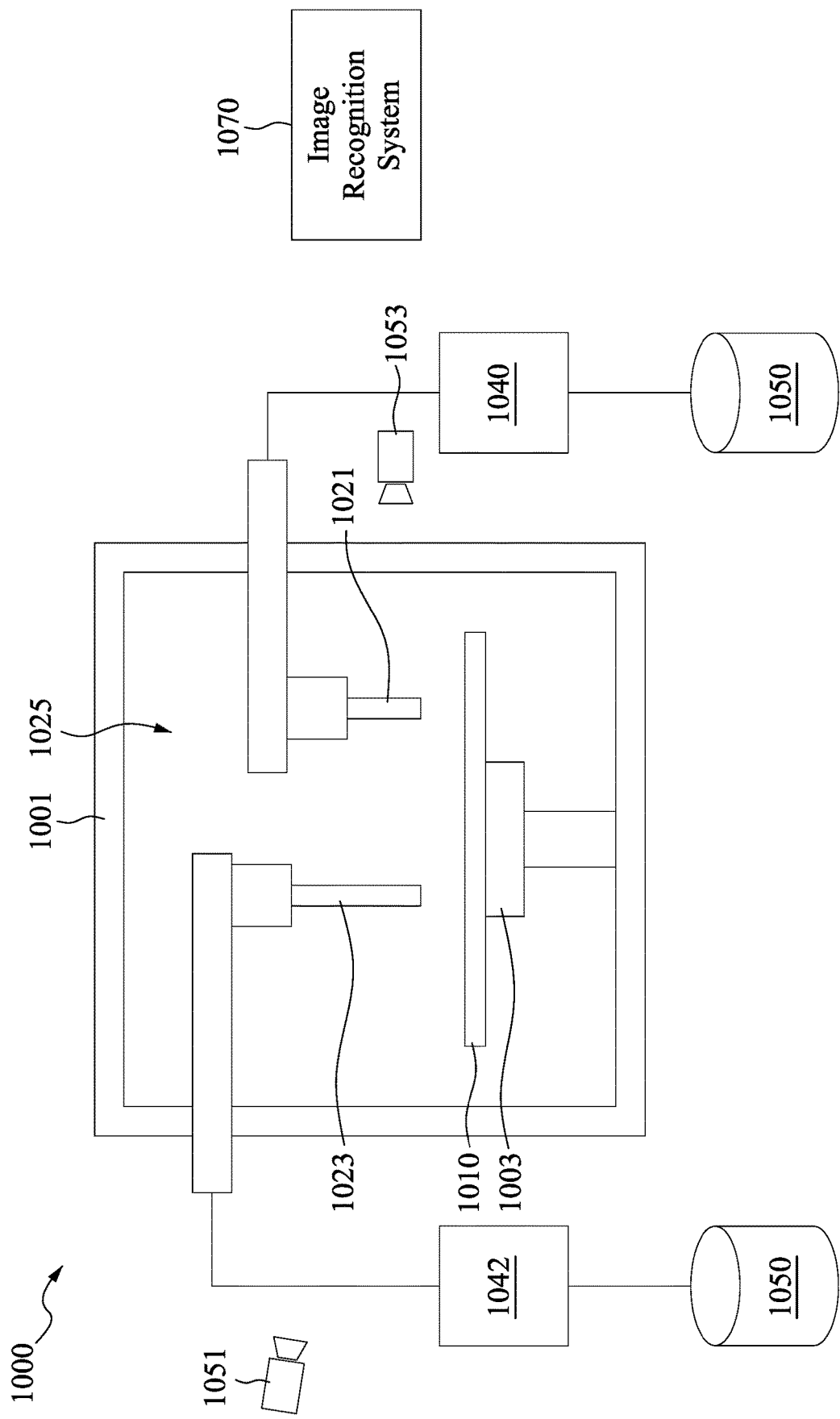
FIGS. 1A and 1B are schematic views of a photoresist coating apparatus according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

As set forth above, reduction of the cost of photoresist is beneficial in the lithography operation. One of the approaches to reduce the cost of the photoresist is to ensure that the nozzle of the dispensing system for dispensing the photoresist dispenses a right amount of the photoresist. Secondly, it is beneficial to ensure that the flow of the photoresist that is being dispensed has the correct pattern (also referred to as a spray pattern) when exiting the nozzle.

In the present disclosure, a method and an apparatus for coating a photoresist over a wafer or a substrate that can reduce the usage of the photoresist slurry without degrading the uniformity of thickness of the coated photoresist are provided. Embodiments of the disclosure are also directed to observing the spray pattern of the photoresist exiting the dispensing nozzle and characterizing the spray patterns to determine acceptable and unacceptable spray patterns. In some embodiments, a neural network or an artificial intelligence based image recognition system is trained to receive one or more images of a nozzle and the spray pattern of the photoresist being dispensed therefrom and to determine acceptable and unacceptable spray patterns. When an unacceptable spray pattern is observed, appropriate corrective actions are taken.

Photoresist is deposited on a semiconductor substrate by dispensing the photoresist from a dispensing nozzle positioned over the central portion of the semiconductor substrate. The photoresist is applied to the semiconductor substrate while the semiconductor substrate is spinning or stationary. If applied while stationary, the semiconductor substrate is then rotated at a high speed (e.g., 10,000 rpm) to spread the photoresist over the surface of the semiconductor substrate by centrifugal force.

The system, according to the embodiments disclosed, includes a dual-lens system for imaging the nozzle and the spray pattern of the photoresist being dispensed therefrom. In the dual-lens system, a first camera system includes a relatively wide-angle camera used to observe the nozzle as the nozzle is travelling to and from the central portion of the semiconductor substrate. A second camera system includes a telescopic camera (or narrow angle camera) for capturing greater magnification, high resolution images of the nozzle and the spray pattern of the photoresist dispensing therefrom. According to embodiments disclosed herein, images of the spray pattern are obtained continuously or at desired (regular or irregular) intervals. Benchmark images indicative of acceptable (or normal) and unacceptable (or abnormal) spray patterns of the photoresist are trained into a neural network or artificial intelligence based image recognition system. The captured images from the camera systems are provided to the image recognition system for determining acceptable and unacceptable spray patterns of the photoresist being dispensed.

Existing systems use only a single camera for taking a wide angle image of the nozzle and the spray pattern. The resolution of the single camera was insufficient for correctly determining the spray pattern and this resulted in increased false alarms due to incorrect image recognition. In addition, the existing systems permit observing the spray pattern through discontinuous images and any defects are recognized only after dispensing process had concluded. Thus, there is a significant delay between recognizing the defect and taking corrective actions.

Figure 1B:
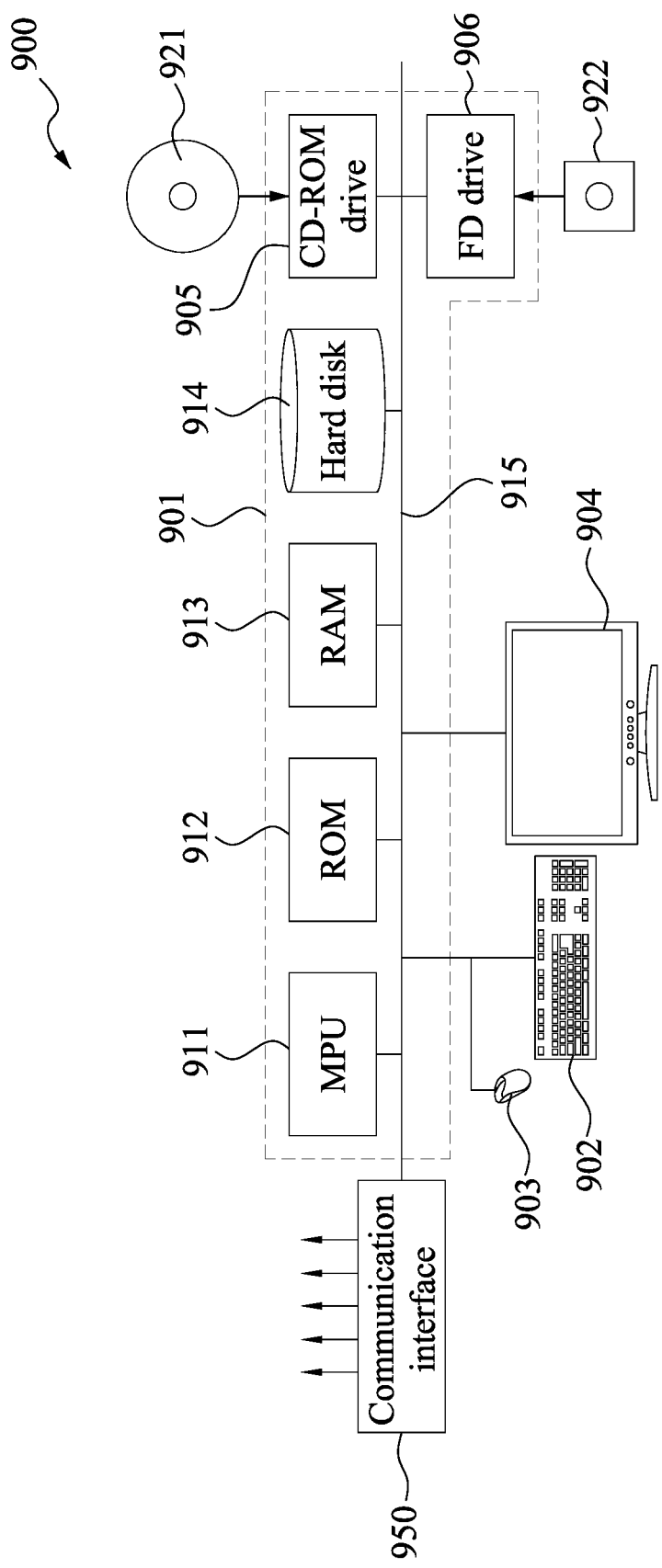

FIGS. 1A and 1B are schematic views of an apparatus 1000 according to various embodiments. In some embodiments, the apparatus 1000 is a lithography or photolithography apparatus for processing a workpiece (e.g., a wafer or semiconductor substrate), in whole or in part, by advanced manufacturing processes. In some embodiments, the apparatus 1000 is a substrate cleaning apparatus. In some embodiments, the apparatus 1000 is a developing apparatus. In some embodiments, the apparatus 1000 is a coating apparatus. In some embodiments, the apparatus 1000 is a wet etching apparatus. In some embodiments, the apparatus 1000 is a polishing apparatus. One of ordinary skill in the art readily understands that one or more of these functions are utilized together with the apparatus 1000 in various embodiments.

The embodiments disclosed herein will first be described in detail with respect to a lithography apparatus 1000, such as a photoresist coater and/or a photoresist developer, which are used for accomplishing deep ultraviolet (DUV) lithography, extreme ultraviolet (EUV) lithography, e-beam lithography, and x-ray lithography, in various embodiments.

A photoresist coating apparatus 1000 includes a housing or an enclosure 1001 in which a substrate holder 1003 is disposed, as shown in FIG. 1A. The substrate holder is configured to hold a wafer or a substrate 1010 by vacuum (vacuum chuck) and include a motor to rotate the wafer at various speeds. The substrate holder 1003 is also configured to move the wafer up and down. The apparatus 1000 includes several fluid nozzles, including a photoresist dispense nozzle 1021 configured to dispense a photoresist and an edge cut solution nozzle 1023 configured to dispense a solvent to remove the coated photoresist from an edge portion of the wafer. In some embodiments, multiple nozzles for different photoresists are provided. The nozzles are coupled to movable arms respectively, and movable in transverse (horizontal) directions and in the vertical direction in some embodiments. The movable arms include one or more of motors, gears, power transfer belts, or other known components to move the nozzles horizontally and/or vertically to and from the central region of the wafer or a semiconductor substrate 1010. The fluid nozzle 1021 is fluidly connected to a photoresist source (e.g., a bottle or a tank) 1015 storing a photoresist, and the edge cut solution nozzle 1023 is fluidly connected to a solvent source 1050 storing a solvent. One or more pumps 1040 with one or more filters and one or more valves are disposed on a fluid path from the photoresist source 1015 to the nozzle 1021, and one or more pumps 1042 with one or more filters and one or more valves are disposed on a fluid path from the solvent source 1050 to the edge cut solution nozzle 1023. A tip end of the nozzle 1021 may be located at a height of 2.5 mm to 3.5 mm from the semiconductor substrate 1010.

In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

Imaging systems including a first camera 1051 and a second camera 1053 are positioned about the apparatus 1000 to capture images of the photoresist dispense nozzle 1021 continuously or at desired intervals. The first camera 1051 is a wide angle camera that captures a wide angle image of the photoresist dispense nozzle 1021 and edge cut solution nozzle 1023 while the photoresist dispense nozzle 1021 is traversing to and from the center of the semiconductor substrate 1010. The first camera 1051 also images the photoresist, or more specifically, spray patterns of the photoresist, when the photoresist leaks or drips from the photoresist dispense nozzle 1021 while the photoresist dispense nozzle 1021 is traversing to and from the center of the semiconductor substrate 1010. The second camera 1053 includes a telescopic camera (e.g., camera including a telephoto lens) having a relatively narrow field of view compared to the first camera 1051 for taking close-up images the photoresist dispense nozzle 1021 and the spray pattern of the photoresist being dispensed therefrom. Stated otherwise, the first camera 1051 has a smaller focal length compared to the second camera 1053 that has a substantially longer focal length. For example, the focal length of the first camera 1051 is less than about 70 mm and the focal length of the second camera 1053 is about 70-200 mm or even higher. The second camera 1053 thus obtains a higher resolution image of the photoresist dispense nozzle 1021 and the spray pattern of the photoresist being dispensed therefrom compared to the first camera 1051. Although illustrated as located on opposite sides of the apparatus 1000, the location of the first camera 1051 and the second camera 1053 is not fixed and the first camera 1051 and the second camera 1053 can be located at any desired position and/or orientation about the apparatus 1000 as long as the desired images of the photoresist dispense nozzle 1021 and spray pattern of the photoresist being dispensed therefrom can be obtained. The first camera 1051 and the second camera 1053 can be moved independent of each other or may move in unison. It should be noted that although the position and/or orientation of the first and second cameras 1051 and 1053 can be changed, the position and/or orientation of the first and second cameras 1051 and 1053 are fixed at time of analysis (e.g., imaging the nozzle 120) and spray patterns for determining acceptable and unacceptable spray patterns. This is because changing the position and/or orientation of the first and/or second cameras 1051 and 1053 between the analysis will change the focal length, magnification, etc., and incorrect images will be captured.

Although embodiments are described with reference to imaging the photoresist dispense nozzle 1021 and spray pattern of the photoresist being dispensed therefrom, embodiments are not limited in this regard. The edge cut solution nozzle 1023 and other different nozzles and spray patterns dispensed therefrom can also be imaged and the spray patterns analyzed (acceptable or unacceptable) using the principles disclosed herein and without departing from the scope of the disclosure.

Figure 1D:
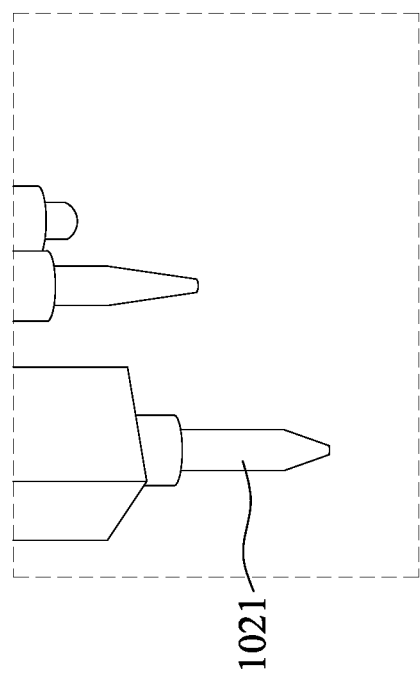
FIG. 1D illustrates an example image of a photoresist dispense nozzle taken by a second camera.
Figure 1C:
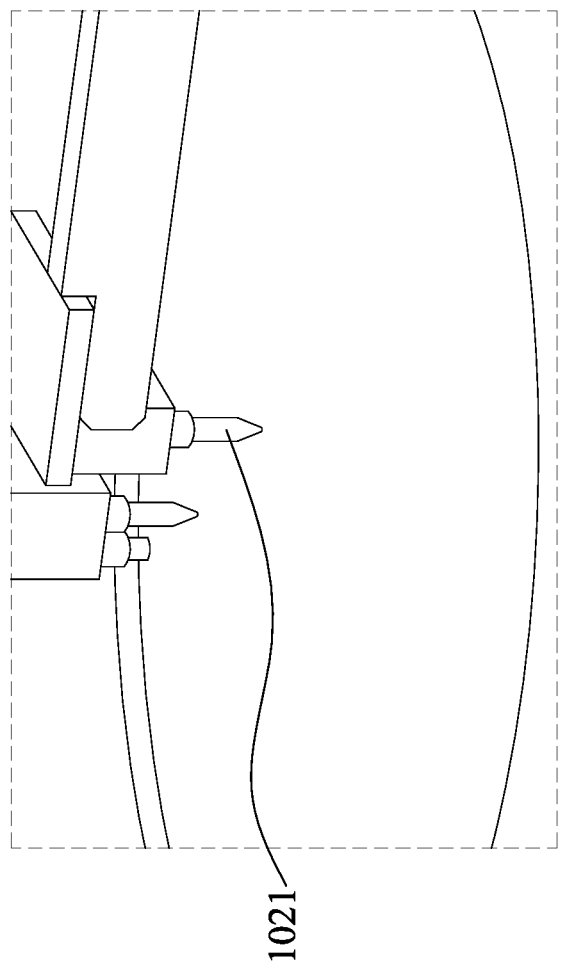
FIG. 1C illustrates an example image of a photoresist dispense nozzle taken by a first camera.

FIG. 1C illustrates an example image of the photoresist dispense nozzle 1021 taken by the first camera 1051. FIG. 1D illustrates an example image of the photoresist dispense nozzle 1021 taken by second camera 1053. As illustrated, the second camera 1053 takes a greater magnification, higher resolution image of the photoresist dispense nozzle 1021 compared to the first camera 1051.

The output of the first camera 1051 and the second camera 1053 is provided to an image recognition system 1070 that analyzes the images from the first camera 1051 and the second camera 1053 to determine acceptable/unacceptable spray patterns of the photoresist from the photoresist dispense nozzle 1021. In some embodiments, the image recognition system 1070 is implemented using the control system 900. The image recognition system 1070 is based on a neural network, machine learning, deep learning or other similar artificial intelligence based technologies. The image recognition system 1070 is trained (or programmed) using acceptable and unacceptable spray patterns for different photoresist dispense nozzles 1021. Different parameters including, but not limited to, dimensions of the arms of the nozzle 1021, arm movement, location and orientation of the cameras, the shape and size of nozzles 1021, size/shape of photoresist droplet, fluid behavior in nozzle, wafer spin, wafer surface, substrate location, chuck vacuum status, motor pin up/down, motor flange, type of photoresist, viscosity (and other properties) of the photoresist, properties of the developer, and/or water are used to train (program) the image recognition system 1070.

At least a part of the operations of the photoresist coating apparatus 1000 and the first and second cameras 1051, 1053 are controlled by a control system 900, as shown in FIG. 1B, communicably connected to or included in the photoresist coating apparatus 1000.

When the control program is executed by the computer, the control system 900 controls the operations of, for example, rotation of the substrate holder 1003, the arms coupled to the nozzles 1021 and 1023, the pump systems 1040, 1042, the location and orientation of the first and second cameras 1051, 1053, the image recognition system 1070, the processing of the images captured by the first and second cameras 1051, 1053, and/or the operation of the first and second cameras 1051, 1053. FIG. 1B also shows a schematic view of a control system 900 that executes control of the photoresist coating apparatus 1000, the first and second cameras 1051, 1053, and the image recognition system 1070 according to one or more embodiments. All of or a part of the process, method and/or operations of the photoresist coating apparatus 1000, the first and second cameras 1051, 1053, and the image recognition system 1070 can be realized using computer hardware and computer programs executed thereon. The control system 900 is provided with a computer 901 including an optical disk read only memory (e.g., CD-ROM or DVD-ROM) drive 905 and a magnetic disk drive 906, a keyboard 902, a mouse 903, and a monitor 904. The computer 901 is provided with, in addition to the optical disk drive 905 and the magnetic disk drive 906, one or more processors 911, such as a micro processing unit (MPU), a read only memory (ROM) 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN. The program for causing the control system 900 to execute the functions of the photoresist coating apparatus 1000, the first and second cameras 1051, 1053, and the image recognition system 1070 is stored in an optical disk 921 or a magnetic disk 922, which are inserted into the optical disk drive 905 or the magnetic disk drive 906, and transmitted to the hard disk 914.

Alternatively, the programming for the photoresist coating apparatus 1000, the first and second cameras 1051, 1053, and the image recognition system 1070 may be transmitted via a network (not shown) to the computer 901 and stored in the hard disk 914. At the time of execution, the programming is loaded into the RAM 913. The program may be loaded from the optical disk 921 or the magnetic disk 922, or directly from a network. The program does not necessarily have to include, for example, an operating system (OS) or a third party program to cause the computer 901 to execute the functions of the photoresist coating apparatus 1000. The program may only include a command portion to call an appropriate function (module) in a controlled mode and obtain desired results.

Figure 2C:
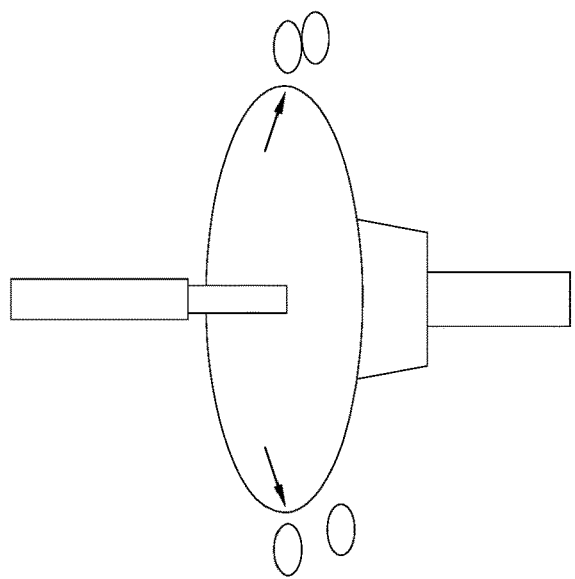
FIGS. 2A, 2B, and 2C illustrate various stages of a sequential process for coating a photoresist on a wafer/substrate according to an embodiment of the present disclosure.
Figure 2B:
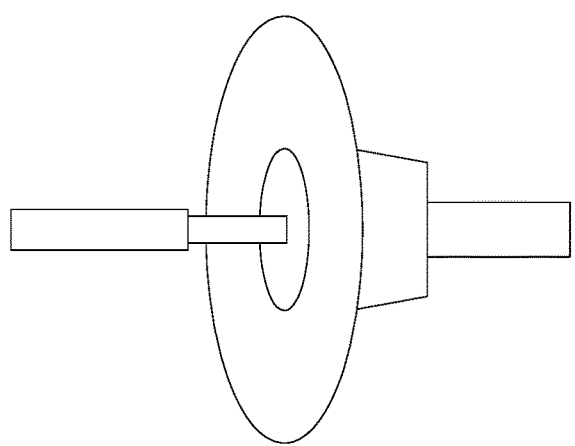
Figure 2A:
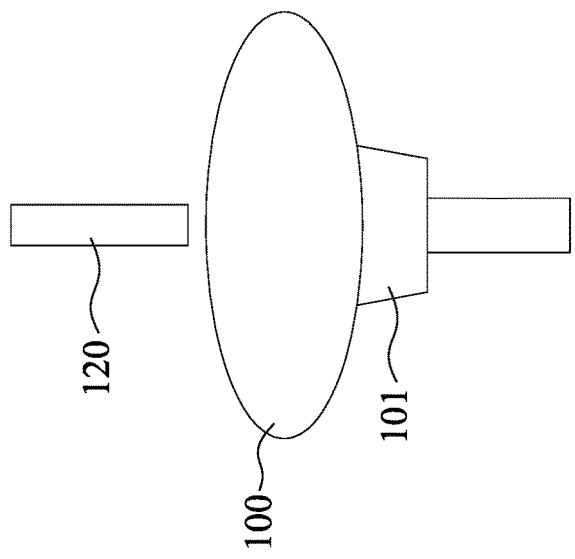

FIGS. 2A-2C show a resist coating operation according to the present disclosure. In some embodiments, the programming for coating a photoresist is stored in a memory of the photoresist coating apparatus (e.g., apparatus 1000). In some embodiments, the programming is stored in a memory, such as a flash memory, a CD-ROM, or DVD-ROM, and can be copied from one apparatus to another apparatus. Further, in some embodiments, the programming is distributed from a server to a plurality of photoresist coating apparatuses.

As shown in FIG. 2A, a wafer 100 is secured to a substrate holder 101 and the wafer 100 is rotated at a predetermined speed. Then, an arm (not shown) carrying a nozzle 120 (e.g., photoresist dispense nozzle 1021) is brought over the wafer 100 and is positioned over the central portion of the wafer 100. A photoresist is then dispensed from the nozzle 120 while the wafer is clockwise rotated as shown in FIG. 2B. In some embodiments, the nozzle 120 is located above the center of the wafer 100. The dispensing of the photoresist continues while the wafer 100 is rotating as shown in FIG. 2C to form a layer of the photoresist on the surface of the wafer 100. After a desired amount of photoresist has been dispensed to form a layer of a desired thickness, the flow of photoresist stops. In some embodiment, the wafer 100 is a semiconductor wafer (e.g., Si wafer) having a diameter of 150 mm, 200 mm or 300 mm. In some embodiments, one or more layers or features are formed on the semiconductor wafer 100.

After the dispensing has stopped, the arm carrying the nozzle 120 is moved away from the wafer 100 such that the arm is no longer positioned over the wafer 100.

In some embodiments, the photoresist is an EUV photoresist, a DUV photoresist, a UV photoresist, or an e-beam photoresist. The photoresist according to the embodiments of the present disclosure is a chemically amplified resist including a polymer resin, a photoactive compound (PAC) and a solvent. In some embodiments, the polymer resin includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like. In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure.

The PACs are photoactive components, such as photoacid generators, photobase generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and s-triazine derivatives, combinations of these, or the like. In some embodiments in which the PACs are photobase generators, the PACs include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, combinations of these, or the like.

In some embodiments, a cross-linking agent is added to the photoresist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments, a quencher is added to the photoresist. A quencher inhibits diffusion of the generated acids/bases/free radicals within the photoresist. The quencher improves the resist pattern configuration as well as the stability of the photoresist over time.

In some embodiments, an organometallic compound is added to the photoresist to increase absorption of EUV. In some embodiments, the organometallic compound includes one or more metal oxide nanoparticles selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof. As used herein, nanoparticles are particles having an average particle size between about 1 nm and about 20 nm. In some embodiments, the metal oxide nanoparticles have an average particle size between about 2 nm and about 5 nm. In some embodiments, the amount of metal oxide nanoparticles in the photoresist composition ranges from about 1 wt. % to about 15 wt. % based on the weight of the solvent. In some embodiments, the amount of nanoparticles in the photoresist composition ranges from about 5 wt. % to about 10 wt. % based on the weight of the solvent.

In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

The viscosity of the photoresist is set to a range of from about 1.0 centipoise (mPa·s) to about 2.5 centipoise is some embodiments. When the viscosity of the photoresist is high, the total dispense amount is set higher than it would be for a lower viscosity photoresist. In some embodiments, the thickness of the photoresist layer is in a range from about 20 nm to about 500 nm and is in a range from about 30 nm to about 120 nm depending on the process requirements (e.g., dry etching selectivity). The thickness can be varied by adjusting one or more of the rotation speed, the time durations in the steps 1-6, the total dispense amount, the nozzle moving speed and/or the nozzle moving amount.

FIG. 3A is a schematic view of the nozzle 120 dispensing the photoresist 301. In some embodiments, the nozzle 120 is the photoresist dispense nozzle 1021. The nozzle 120 is considered to be defect-free and operating normally (or as intended) for dispensing a desired spray pattern of the photoresist 301 from an outlet 303. The nozzle 120 and the spray pattern dispensed therefrom are considered a benchmark and, as discussed below, other nozzles and the corresponding spray patterns are compared to the benchmark nozzle and the spray pattern to determine whether the other nozzles are defect-free. For purposes of discussion herein, the spray pattern of the photoresist 301 being dispensed from the nozzle 120 is a steady, continuous stream of uniform thickness. For the purposes of discussion herein, the nozzle 120 is assumed to have a generally conical body having width W which reduces from the top portion to the bottom portion of the nozzle including the outlet 303. In disclosed embodiments, the width dimension is considered transverse to the direction of flow of the photoresist 301. The nozzle 120 dispensing the photoresist 301 is imaged by the second camera 1053 to determine any abnormalities in the spray pattern. While the steady, continuous stream of the photoresist 301 illustrated in FIG. 3A, is considered as the normal (intended) spray pattern from the defect-free nozzle 120, this is just an example. In other embodiments, spray patterns having other shapes and sizes are considered as the normal (intended) spray pattern. In some embodiments, other normal (intended) spray patterns include flat fan (producing a line of spray), full cone (producing a solid circle of spray), hollow cone (producing a ring of spray), and mist/fog. For the purposes of discussion herein, spray patterns other than the spray pattern considered normal (intended) are considered as abnormal/unacceptable spray patterns. As discussed below, the abnormal/unacceptable spray patterns are indicative of a defective nozzle 120. It should be noted that a defect-free nozzle may not be entirely defect-free. Some defects may be present, but the defects may not affect the spray pattern being dispensed or may affect the spray pattern within a desired margin of error.

FIG. 3B illustrates an image of the nozzle 120 after image processing has been performed, according to embodiments of the disclosure. In some embodiments, the image is obtained using the second camera 1053 and the image is processed using the image recognition system 1070. The image processing includes determining the width W of the nozzle 120 and the width of the spray pattern 301 exiting the nozzle 120 at predetermined vertical intervals (or pitch) along the nozzle 120. In some embodiments, the width W at an interval is determined based on the number of pixels arranged end to end in that interval. Because the width W along the nozzle 120 decreases (from top to bottom), the number of pixels in each interval is less than the number of pixels in the preceding interval.

Referring to FIG. 3B, and as an example, image processing involves vertically dividing the nozzle 120 into multiple intervals. FIG. 3B illustrates intervals 351, 352, and 353 with interval 351 being the topmost interval and interval 353 being the bottommost interval. The nozzle 120 includes one or more intervals 351, one or more intervals 352, and one or more intervals 353. Multiple intervals 351, 352, and 353 are illustrated.

The intervals 351, 352, and 353 are arranged continuously from top to bottom (i.e., no gaps between adjacent intervals), or, as illustrated, adjacent intervals are separated by a predetermined gap. In some embodiments, each interval 351, 352, and 353 includes a plurality of pixels arranged end to end.

The widths W of the intervals 352 that occupy the majority (e.g., around 75%-80%) of the central portion the body of nozzle 120 are considered as a threshold width. The intervals 351 above intervals 352 are considered to have a width that is greater than the threshold width. The intervals 353 below the intervals 352 are considered to have a width less than the threshold width. A benefit of defining threshold width is that the abnormal images always show a bigger/wider pixels (e.g., a bubble shows a circle), and wider the pixels, the more influence it has on the slope. Therefore, the normal dispense image is initially obtained to define the threshold of pixels.

The second camera also captures images of the spray patterns. The spray pattern is divided into multiple intervals. The spray pattern 301 that exits the nozzle 120 from the outlet 303 is a steady continuous stream (flow) having a substantially same width. The widths W of each interval are determined to be less than the intervals 352 (threshold widths) and are classified as intervals 353.

Figure 3C:
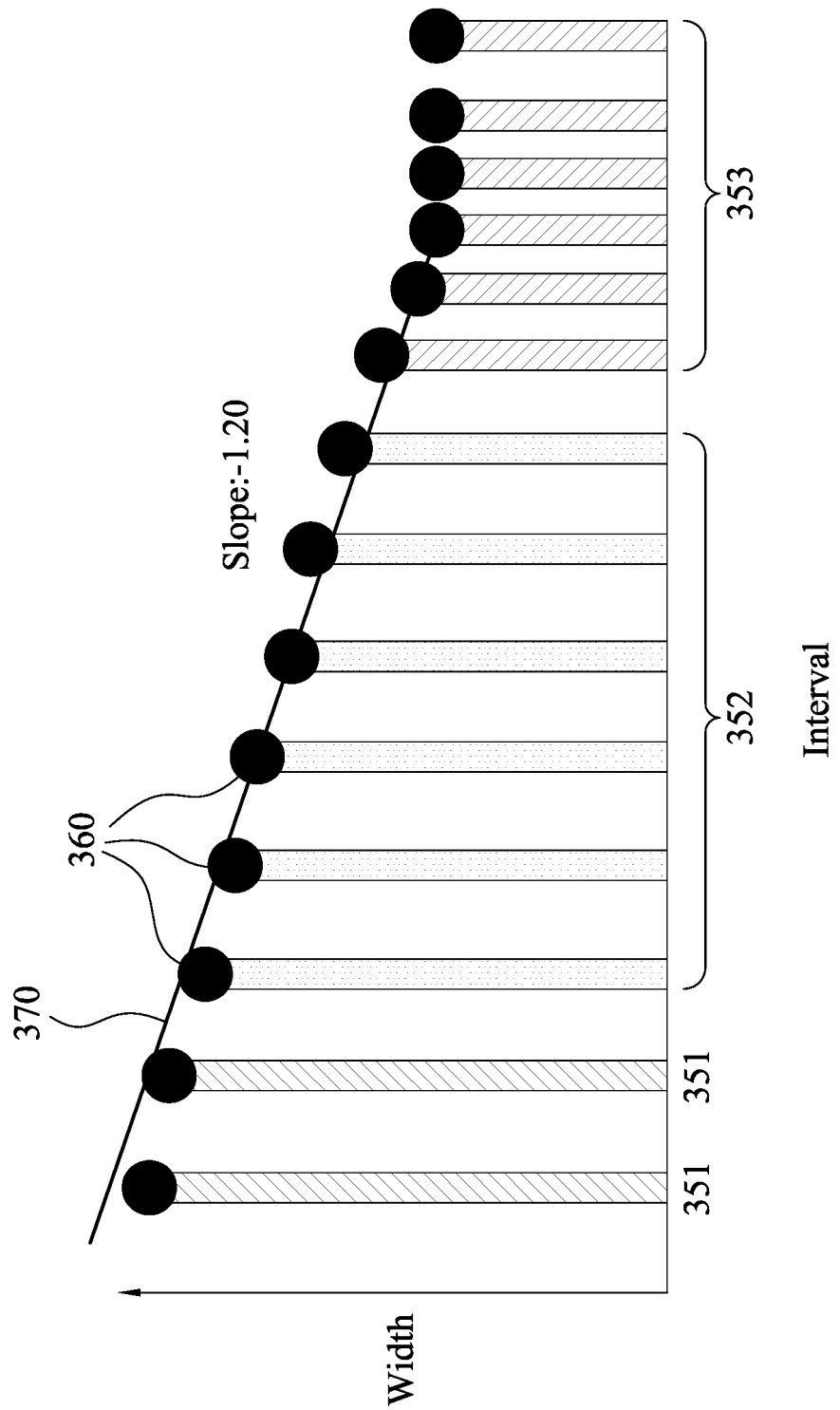
FIG. 3C is a graph illustrating the intervals of FIG. 3B plotted along the abscissa for determining the slope, according to embodiments of the disclosure.

FIG. 3C illustrates the intervals 351, 352, and 353 plotted along the abscissa starting from the top to the bottom. The values of the widths of the intervals 351, 352, and 353 represent a series of data points 360. A straight line 370 is fit to the widths W and the slope of the straight line 370 is determined. In FIG. 3C, the slope of the straight line 370 is −1.2. This slope is considered as the benchmark slope and is used to determine a condition (acceptable or unacceptable) of the spray patterns, as discussed further below. In this manner, a benchmark image of a normally operating nozzle 120 and a benchmark slope are obtained.

It should be noted that the image processing discussed above is specific to the nozzle 120 having the given dimensions (shape, size, cone eccentricity, etc.). In a similar manner, images of other nozzles (having different dimensions) and their corresponding spray patterns can be characterized to obtain the corresponding slopes. Each slope thus is indicative of a normally functioning, defect-free nozzle that outputs a corresponding acceptable spray pattern. The slope information and/or the interval information is used to train the neural network of the image recognition system 1070 to determine acceptable and unacceptable spray patterns for a specific type of nozzle. In other words, the normal dispense pattern condition defines a target slope defined by pixels, and this slope is used as a benchmark to check each image obtained from the second camera.

FIGS. 4A-4E are schematic views of different unacceptable spray patterns dispensed from the nozzle 120, according to embodiments of the disclosure. Also illustrated are the results of the image processing performed on the nozzle 120 and the corresponding unacceptable spray patterns from the nozzle 120. The unacceptable spray patterns are obtained because of a defective nozzle 120. The image processing is performed with reference to the image processing results of the defect-free nozzle 120 and the spray pattern dispensed therefrom (FIGS. 3A and 3B).

FIG. 4A illustrates a case where a bubble of the photoresist 301 is formed at the outlet 303, instead of a steady stream (FIG. 3A). FIG. 4B illustrates a case where multiple bubbles, referred to as micro bubbles, of the photoresist 301 are formed at the outlet 303. FIG. 4C illustrates a case where the photoresist 301 condenses around the outlet 303. This is considered as a case of mild condensation since the condensation is only on one side of the outlet 303 and the outlet 303 is not blocked. FIG. 4D illustrates a severe case of condensation where the photoresist 301 condenses around the entire outlet 303 and the outlet 303 is not blocked. FIG. 4E illustrates a very severe case of condensation where the photoresist 301 condenses around the outlet 303 and the outlet 303 is blocked. In each of FIGS. 4C, 4D, and 4E, the presence of the condensation affects the spray pattern. In FIGS. 4C and 4D, the spray pattern may be a thin streak. In FIG. 4E, because the outlet 303 is blocked, photoresist 301 may not flow. It should be noted that other conditions that cause an abnormal spray pattern (and thus indicative of a defective nozzle) are also possible and the cases illustrated in FIGS. 4A-4E are just some examples.

When image processing, the second camera 1053 images the nozzle 120 and the spray pattern of the photoresist 301 being dispensed. The image processing divides the image of the nozzle 120 and the spray pattern into multiple intervals. The different intervals in the nozzle and spray pattern are classified (or categorized) based on the benchmark nozzle 120 (FIG. 3B). Thus, referring to FIGS. 4A-4E, the different intervals are classified as intervals 351, 352 or 353 based on whether of the respective widths are greater than, equal to, or less than the threshold widths of nozzle 120.

Figure 4F:
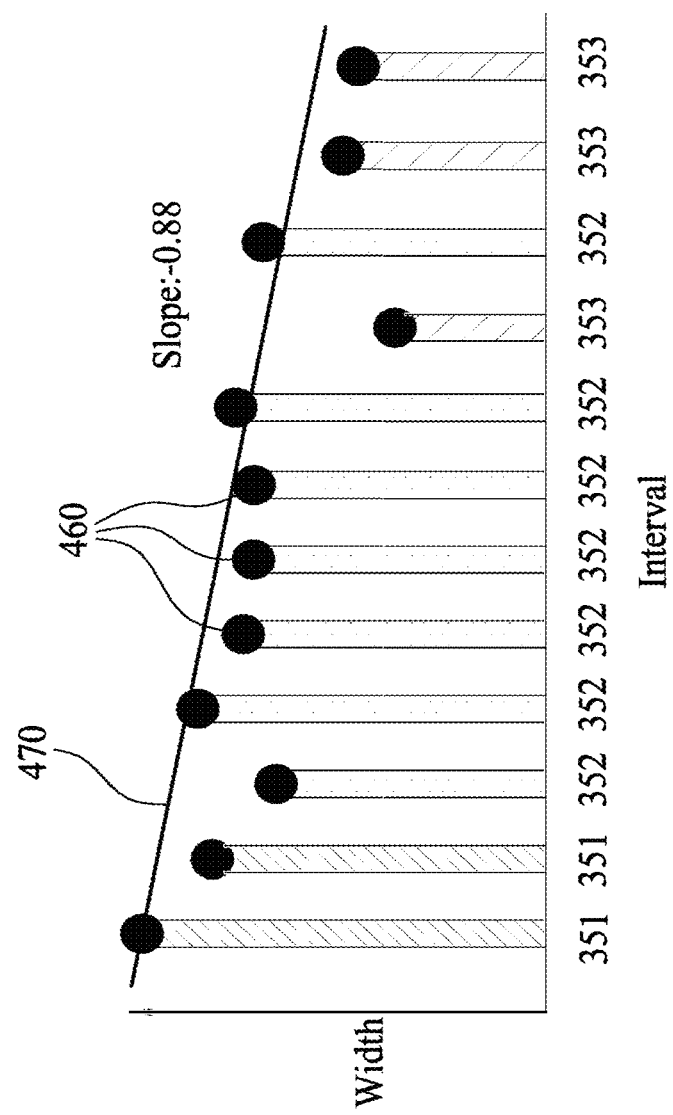
FIG. 4F is a graph illustrating the intervals of FIG. 4B plotted along the abscissa for determining the slope, according to embodiments of the disclosure.

The process of fitting a straight line and determining the slope is described with reference to FIGS. 4B and 4F. As illustrated in FIG. 4F, the intervals 351, 352, and 353 obtained from FIG. 4B are plotted along the abscissa (positive X-axis direction) starting from the top to the bottom. The values of the widths of the intervals 351, 352, and 353 represent a series of data points 460. A straight line 470 is fit to the widths W and the slope of the straight line 470 is determined. In FIG. 4F, the slope of the straight line 470 is determined to be −0.88. Because the slope is greater than −1.20, the nozzle in FIG. 4B is considered a defective nozzle.

When a defective nozzle is determined, a necessary corrective action can be undertaken to improve the spray pattern. The corrective actions can include changing the nozzle, check the operation of the dispense arm and correct any malfunction, and/or flushing the photoresist.

It should be noted that the nozzle is considered defect-free if the slope is within a range of the slope of the benchmark nozzle. In some embodiments, the nozzle is considered defect-free if the slope is within +/−0.2 of the benchmark slope. For example, referring FIG. 3C, the slope that is within +/−0.2 of −1.20 indicates a defect-free nozzle. In some other embodiments, the nozzle is considered defect-free if the slope is within +/−0.15 of the benchmark slope. In some embodiments, the nozzle is considered defect-free if the slope is within +/−0.1 of the benchmark slope.

The process in FIG. 4F is performed by the image recognition system 1070 that is provided with the processed image in FIG. 4B of which the image recognition system 1070 determines the slope. The image recognition system 1070 initially calculates the slope to determine whether the spray pattern is normal by comparing it against the benchmark slope. The result is then provided to the neural network for further analysis. The neural network is trained to determine acceptable and unacceptable spray patterns for different nozzle types. The neural network then further analyzes the spray pattern to determine whether the spray pattern is acceptable or unacceptable. In case, an unacceptable spray pattern is determined by the neural network, an alarm (or other indication) is generated for the operator to intervene. Production may be halted and the operator confirms if the alarm is true or false. If the operator determines the spray pattern is indeed unacceptable (and thus indicates a defective nozzle), then the operator takes one or more corrective actions (e.g., replace the defective nozzle). If the operator determines the spray pattern is acceptable, the alarm is ignored and production restarted. The neural network is also trained with this false positive condition. With such continued training, the false alarm rate is reduced.

In some embodiments, the first camera 1051 images the nozzle 1021 and any photoresist leaks or drips before and after the photoresist has been dispensed on the semiconductor substrate. In other words, the first camera 1051 images the photoresist dispense nozzle 1021 before and after the photoresist has been dispensed. In some embodiments, if a malfunction is detected by the first camera 1051, for example, if the first camera 1051 detects photoresist leaks while the dispense arm is moving towards and away from the semiconductor substrate, an alarm or notification would be generated to indicate a malfunction. In some embodiments, when the malfunction is indicated by the first camera 1051, the images captured by the second camera 1053 are ignored. Alternatively, if the first camera 1051 does not indicate a malfunction, the images captured by the second camera 1053 are analyzed using the method according to the embodiments disclosed herein.

Embodiments of the disclosure determine unacceptable spray patterns while the photoresist is being dispensed. By determining the unacceptable spray pattern while the photoresist is dispensed, any defects in the equipment can be determined in real time and corrective action can be taken with minimal delay.

It will be understood that not all advantages have been necessarily discussed herein, no particular advantage is required for all embodiments or examples, and other embodiments or examples may offer different advantages.

In accordance with an aspect of the present disclosure, a method of manufacturing a semiconductor device includes obtaining a first image of a fluid dispense nozzle using a first camera, the fluid dispense nozzle configured to dispense fluid on a semiconductor substrate. The method further includes obtaining a second image of the fluid dispense nozzle using a second camera, the second image having a higher resolution than the first image, determining a width of the fluid dispense nozzle at multiple intervals along the fluid dispense nozzle and a width of a spray pattern of a fluid being dispensed from the fluid dispense nozzle at multiple intervals along the spray pattern, fitting a first straight line to a series of data points representing a plurality of widths of the intervals along the fluid dispense nozzle and a plurality of widths of the intervals along the spray pattern; determining a first slope of the first straight line, and determining a condition of the spray pattern and the fluid dispense nozzle based on the first slope. In some embodiments, the method further includes obtaining an image of a benchmark fluid dispense nozzle using the second camera, wherein the benchmark nozzle is a defect-free nozzle, determining a width of the benchmark fluid dispense nozzle at multiple intervals along the benchmark fluid dispense nozzle and a width of a spray pattern of fluid being dispensed from the benchmark fluid dispense nozzle at multiple intervals along the spray pattern, fitting a second straight line to a series of data points representing a plurality of widths of the intervals along the benchmark fluid dispense nozzle and a plurality of widths of the intervals along the spray pattern, determining a second slope of the second straight line, and comparing the first slope and the second slope to determine the condition of the fluid dispense nozzle. In some embodiments, the method further includes determining that the fluid dispense nozzle is defective when the first slope is greater than the second slope. In some embodiments, the method further includes determining that the fluid dispense nozzle is defect-free when the first slope is equal to or less than the second slope. In some embodiments, the method further includes comparing the first slope and the second slope to determine the condition of the fluid dispense nozzle using a neural network. In some embodiments, the method further includes training the neural network with a plurality of images of the benchmark fluid dispense nozzle and spray patterns, and with the first and second images of the fluid dispense nozzle. In some embodiments, the first camera obtains the first image of the fluid dispense nozzle while the nozzle is travelling to and from a position directly above the semiconductor substrate. In some embodiments, the second camera obtains the second image of the fluid dispense nozzle while the nozzle is positioned over the semiconductor substrate and dispensing fluid. In some embodiments, the method further includes identifying a first set of intervals, a second set of intervals, and a third set of intervals of the multiple intervals of the benchmark fluid dispense nozzle, wherein intervals in the first set of intervals have a threshold width, intervals in the second set of intervals have width greater than the threshold width, intervals in the third set of intervals have width less than the threshold width, classifying the widths of the fluid dispense nozzle at each interval as having one of a threshold width, a width greater than the threshold width, and a width less than the threshold width, and classifying the widths of the spray pattern dispensed from the fluid dispense nozzle at each interval as having one of a threshold width, a width greater than the threshold width, and a width less than the threshold width. In some embodiments, the fluid dispense nozzle is included in a photolithography apparatus, the fluid dispense nozzle dispenses a photoresist composition, and the method further includes using the photolithography apparatus for performing an extreme ultraviolet (EUV) lithography operation.

In accordance with another aspect of the present disclosure, an apparatus for manufacturing a semiconductor device includes a fluid dispense nozzle configured to dispense a photoresist composition, a first camera configured to obtain a first image of the fluid dispense nozzle, a second camera configured to obtain a second image of the fluid dispense nozzle, the second image having a higher resolution than the first image, and an image recognition system operably coupled to the first and second cameras. The image recognition system includes a memory storing instructions, and at least one processor that executes the instructions to perform a method that includes obtaining an image of a benchmark fluid dispense nozzle using the second camera, wherein the benchmark nozzle is a defect-free nozzle, determining a width of the benchmark fluid dispense nozzle at multiple intervals along the benchmark fluid dispense nozzle and a width of a spray pattern of photoresist being dispensed from the benchmark fluid dispense nozzle at multiple intervals along the spray pattern, fitting a first straight line to a series of data points representing a plurality of widths of the intervals along the benchmark fluid dispense nozzle and a plurality of widths of the intervals along the spray pattern, and determining a first slope of the first straight line. In some embodiments, the at least one processor executes the instructions to perform the method that further includes obtaining a first image of the fluid dispense nozzle using the first camera, obtaining a second image of the fluid dispense nozzle using the second camera, determining a width of the fluid dispense nozzle at multiple intervals along the fluid dispense nozzle and a width of a spray pattern of photoresist being dispensed from the fluid dispense nozzle at multiple intervals along the spray pattern, fitting a second straight line to a series of data points representing a plurality of widths of the intervals along the fluid dispense nozzle and a plurality of widths of the intervals along the spray pattern, determining a second slope of the second straight line, and determining whether the fluid dispense nozzle is defective by comparing the first slope and the second slope. In some embodiments, the method includes determining that the fluid dispense nozzle is defective when the second slope is greater than the first slope. In some embodiments, the method includes determining that the fluid dispense nozzle is defect-free when the second slope is equal to or less than the first slope. In some embodiments, the image recognition system includes a neural network that is trained with a plurality of images of the benchmark fluid dispense nozzle and spray patterns, and with the first and second images of the fluid dispense nozzle. In some embodiments, the first camera obtains the first image of the fluid dispense nozzle while the nozzle is travelling to and from a position directly above the semiconductor substrate. In some embodiments, the second camera obtains the second image of the fluid dispense nozzle while the nozzle is positioned over the semiconductor substrate and dispensing fluid.

Another aspect of the present disclosure includes a non-transitory, computer readable medium including instructions stored in a memory and which are executed by a processor to perform a method for manufacturing a semiconductor device. The method includes obtaining a first image of a fluid dispense nozzle using a first camera, the fluid dispense nozzle configured to dispense photoresist on a semiconductor substrate, obtaining a second image of the fluid dispense nozzle using a second camera, the second image having a higher resolution than the first image, determining a width of the fluid dispense nozzle at multiple intervals along the fluid dispense nozzle and a width of a spray pattern of a photoresist being dispensed from the fluid dispense nozzle at multiple intervals along the spray pattern, fitting a first straight line to a series of data points representing a plurality of widths of the intervals along the fluid dispense nozzle and a plurality of widths of the intervals along the spray pattern, determining a first slope of the first straight line, obtaining an image of a benchmark fluid dispense nozzle using the second camera, wherein the benchmark nozzle is a defect-free nozzle, determining a width of the benchmark fluid dispense nozzle at multiple intervals along the benchmark fluid dispense nozzle and a width of a spray pattern of the photoresist being dispensed from the benchmark fluid dispense nozzle at multiple intervals along the spray pattern, fitting a second straight line to a series of data points representing a plurality of widths of the intervals along the benchmark fluid dispense nozzle and a plurality of widths of the intervals along the spray pattern, determining a second slope of the second straight line, and comparing the first slope and the second slope to determine whether the fluid dispense nozzle is defective. In some embodiments, the method further includes determining that the fluid dispense nozzle is defective when the first slope is greater than the second slope. In some embodiments, the method further includes determining that the fluid dispense nozzle is defect-free when the first slope is equal to or less than the second slope.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    obtaining a first image of a fluid dispense nozzle using a first camera, the fluid dispense nozzle configured to dispense fluid on a semiconductor substrate;
    obtaining a second image of the fluid dispense nozzle using a second camera, the second image having a higher resolution than the first image;
    determining a width of the fluid dispense nozzle at multiple intervals along the fluid dispense nozzle and a width of a spray pattern of a fluid being dispensed from the fluid dispense nozzle at multiple intervals along the spray pattern;
    fitting a first straight line to a series of data points representing a plurality of widths of the intervals along the fluid dispense nozzle and a plurality of widths of the intervals along the spray pattern;
    determining a first slope of the first straight line; and
    determining a condition of the spray pattern and the fluid dispense nozzle based on the first slope.

2. The method of claim 1, further comprising:
    obtaining an image of a benchmark fluid dispense nozzle using the second camera, wherein the benchmark fluid dispense nozzle is a defect-free nozzle;
    determining a width of the benchmark fluid dispense nozzle at multiple intervals along the benchmark fluid dispense nozzle and a width of a spray pattern of fluid being dispensed from the benchmark fluid dispense nozzle at multiple intervals along the spray pattern;
    fitting a second straight line to a series of data points representing a plurality of widths of the intervals along the benchmark fluid dispense nozzle and a plurality of widths of the intervals along the spray pattern;
    determining a second slope of the second straight line; and
    comparing the first slope and the second slope to determine the condition of the fluid dispense nozzle.

3. The method of claim 2, further comprising:
    determining that the fluid dispense nozzle is defective when the first slope is greater than the second slope.

4. The method of claim 2, further comprising:
    determining that the fluid dispense nozzle is defect-free when the first slope is equal to or less than the second slope.

5. The method of claim 2, further comprising:
comparing the first slope and the second slope to determine the condition of the fluid dispense nozzle using a neural network.

6. The method of claim 5, further comprising:
training the neural network with a plurality of images of the benchmark fluid dispense nozzle and spray patterns, and with the first and second images of the fluid dispense nozzle.

7. The method of claim 2, further comprising:
identifying a first set of intervals, a second set of intervals, and a third set of intervals of the multiple intervals of the benchmark fluid dispense nozzle, wherein intervals in the first set of intervals have a threshold width, intervals in the second set of intervals have width greater than the threshold width, intervals in the third set of intervals have width less than the threshold width;
classifying the widths of the fluid dispense nozzle at each interval as having one of a threshold width, a width greater than the threshold width, and a width less than the threshold width; and
classifying the widths of the spray pattern dispensed from the fluid dispense nozzle at each interval as having one of a threshold width, a width greater than the threshold width, and a width less than the threshold width.

8. The method of claim 1, wherein the first camera obtains the first image of the fluid dispense nozzle while the nozzle is travelling to and from a position directly above the semiconductor substrate.

9. The method of claim 1, wherein the second camera obtains the second image of the fluid dispense nozzle while the nozzle is positioned over the semiconductor substrate and dispensing fluid.

10. The method of claim 1, wherein the fluid dispense nozzle is included in a photolithography apparatus, the fluid dispense nozzle dispenses a photoresist composition, and the method further comprises using the photolithography apparatus for performing an extreme ultraviolet (EUV) lithography operation.

11. A non-transitory, computer readable medium comprising instructions stored in a memory which, when executed by a processor cause the processor to perform a method for manufacturing a semiconductor device, the method comprising:
obtaining a first image of a fluid dispense nozzle using a first camera, the fluid dispense nozzle configured to dispense photoresist on a semiconductor substrate;
obtaining a second image of the fluid dispense nozzle using a second camera, the second image having a higher resolution than the first image;
determining a width of the fluid dispense nozzle at multiple intervals along the fluid dispense nozzle and a width of a spray pattern of a photoresist being dispensed from the fluid dispense nozzle at multiple intervals along the spray pattern;
fitting a first straight line to a series of data points representing a plurality of widths of the intervals along the fluid dispense nozzle and a plurality of widths of the intervals along the spray pattern;
determining a first slope of the first straight line;
obtaining an image of a benchmark fluid dispense nozzle using the second camera, wherein the benchmark nozzle is a defect-free nozzle;
determining a width of the benchmark fluid dispense nozzle at multiple intervals along the benchmark fluid dispense nozzle and a width of a spray pattern of the photoresist being dispensed from the benchmark fluid dispense nozzle at multiple intervals along the spray pattern;
fitting a second straight line to a series of data points representing a plurality of widths of the intervals along the benchmark fluid dispense nozzle and a plurality of widths of the intervals along the spray pattern;
determining a second slope of the second straight line; and
comparing the first slope and the second slope to determine whether the fluid dispense nozzle is defective.

12. The non-transitory, computer readable medium of claim 11, wherein the method further comprises:
determining that the fluid dispense nozzle is defective when the first slope is greater than the second slope.

13. The non-transitory, computer readable medium of claim 11, wherein the method further comprises:
determining that the fluid dispense nozzle is defect-free when the first slope is equal to or less than the second slope.

14. A method for manufacturing a semiconductor device, comprising:
obtaining a first image of a fluid dispense nozzle using a first camera, the fluid dispense nozzle configured to dispense fluid on a semiconductor substrate;
obtaining a second image of the fluid dispense nozzle using a second camera, the second image having a higher resolution than the first image;
determining a width of the fluid dispense nozzle at multiple intervals along the fluid dispense nozzle and a width of a spray pattern of a fluid being dispensed from the fluid dispense nozzle at multiple intervals along the spray pattern;
fitting a first straight line to a series of data points representing a plurality of widths of the intervals along the fluid dispense nozzle and a plurality of widths of the intervals along the spray pattern;
determining a first slope of the first straight line;
comparing the first slope and a benchmark slope to determine a condition of the fluid dispense nozzle; and
determining that the fluid dispense nozzle is defective when the first slope is greater than the benchmark slope.

15. The method of claim 14, further comprising:
obtaining an image of a benchmark fluid dispense nozzle using the second camera, wherein the benchmark fluid dispense nozzle is a defect-free nozzle;
determining a width of the benchmark fluid dispense nozzle at multiple intervals along the benchmark fluid dispense nozzle and a width of a spray pattern of fluid being dispensed from the benchmark fluid dispense nozzle at multiple intervals along the spray pattern;
fitting a second straight line to a series of data points representing a plurality of widths of the intervals along the benchmark fluid dispense nozzle and a plurality of widths of the intervals along the spray pattern; and
determining the benchmark slope based on the second straight line.

16. The method of claim 15, further comprising:
determining that the fluid dispense nozzle is defect-free when the first slope is equal to or less than the benchmark slope.

17. The method of claim 15, further comprising:
comparing the first slope and the benchmark slope to determine the condition of the fluid dispense nozzle using a neural network.

18. The method of claim 17, further comprising:
training the neural network with a plurality of images of the benchmark fluid dispense nozzle and spray patterns, and with the first and second images of the fluid dispense nozzle.

19. The method of claim 15, further comprising:
identifying a first set of intervals, a second set of intervals, and a third set of intervals of the multiple intervals of the benchmark fluid dispense nozzle, wherein intervals in the first set of intervals have a threshold width, intervals in the second set of intervals have width greater than the threshold width, intervals in the third set of intervals have width less than the threshold width;

classifying the widths of the fluid dispense nozzle at each interval as having one of a threshold width, a width greater than the threshold width, and a width less than the threshold width; and classifying the widths of the spray pattern dispensed from the fluid dispense nozzle at each interval as having one of a threshold width, a width greater than the threshold width, and a width less than the threshold width.

20. The method of claim 15, wherein the first camera obtains the first image of the fluid dispense nozzle while the nozzle is travelling to and from a position directly above the semiconductor substrate.

* * * * *